United States Patent [19]

Fredericks

[11] 4,096,290

[45] Jun. 20, 1978

[54] RESIST MASK FORMATION PROCESS WITH HALOALKYL METHACRYLATE COPOLYMERS

[75] Inventor: Edward Carmine Fredericks, Hopewell Junction, N.Y.

[73] Assignee: International Business Machines Corporation, Armonk, N.Y.

[21] Appl. No.: 729,246

[22] Filed: Oct. 4, 1976

[51] Int. Cl.$^2$ .............................................. B05P 3/06
[52] U.S. Cl. ......................................... 427/43; 96/35; 96/36.2; 427/44; 427/93; 427/273; 427/336; 427/385 R; 526/292
[58] Field of Search .................. 427/43, 44, 273, 336, 427/372, 385 R, 93; 96/35, 36.2; 204/159.16; 526/292

[56] References Cited

U.S. PATENT DOCUMENTS

| | | | |
|---|---|---|---|
| 3,255,163 | 6/1966 | Gobran et al. | 526/292 |
| 3,732,190 | 5/1973 | Balle et al. | 526/292 |
| 3,981,985 | 9/1976 | Roberts | 427/43 |

Primary Examiner—Ronald H. Smith
Assistant Examiner—Dennis C. Konopacki
Attorney, Agent, or Firm—David M. Bunnell

[57] ABSTRACT

A positive relief image is produced by coating a substrate with a layer of a copolymer containing about 90–98 mole percent of polymerized lower alkyl methacrylate units and about 2–10 mole percent of polymerized lower haloalkyl methacrylate units, heating the layer to cause cross-linking between polymer chains by removal of hydrogen halide, patternwise exposing the layer with high energy radiation such as a scanning electron beam, and removing the exposed portion of the layer with a solvent developer.

The purpose of this abstract is to enable the public and the Patents and Trademark Office to rapidly determine the subject matter of the technical disclosure of the application. This abstract is neither intended to define the invention of the application nor is it intended to be limiting as to the scope thereof.

6 Claims, No Drawings

RESIST MASK FORMATION PROCESS WITH HALOALKYL METHACRYLATE COPOLYMERS

BACKGROUND OF THE INVENTION

This invention relates generally to the formation of positive relief images in layers of radiation degradable polymers and more specifically to a process for forming positive resist masks using haloalkyl methacrylate copolymers.

The formation of positive resist masks from layers of radiation degradable methacrylate polymers is described, for example, by Haller et al in U.S. Pat. No. 3,535,137; by Gipstein et al in U.S. Pat. No. 3,779,806; in copending application Ser. No. 545,063 filed Jan. 29, 1975, now U.S. Pat. No. 4,011,351, and assigned to the assignee of this application entitled "Preparation of Resist Image With Methacrylate Polymers"; by R. A. Harris "Polymethyl Methacrylate as an Electron Sensitive Resist" Journal of Electrochemical Society, Vol. 120, No. 2, pages 270-274, February 1973; and by E. D. Roberts "A modified Methacrylate Positive Electron Resist" Applied Polymer Symposium, No. 23, pages 87-98 (1974). The masks are useful in the fabrication of integrated circuits, printing plates and the like.

Generally, the resist masks are prepared by coating a layer of the radiation degradable polymer on a substrate and subjecting the layer to patternwise exposure to high energy radiation such as x-rays or electrons. The substrate may be pre-treated with an adhesion promotor before coating the resist layer. The irradiated portions of the resist are degraded and become more soluble. A developer is then used to remove the irradiated portions of the layer. The substrate can then be subjected to an additive or substractive process such as metallization, ion implantation, or etching with the remaining portions of the resist layer acting to protect the substrate from the processing. When the exposure is made with a focused, scanning electron beam, the exposure step is a lengthy process with the time required being largely dependent upon the exposure energy which is required to degrade the polymer to a sufficient extent so that a satisfactory pattern can be reproducably developed in a reasonable time without excessive loss or swelling of the unexposed resist layer.

Haller et al, U.S. Pat. No. 3,535,137 describes the use of methacrylate polymers containing a quaternary carbon in the polymer backbone such as polymethyl methacrylate, and copolymers of methyl methacrylate with, for example, 2-hydroxyethyl methacrylate. Gipstein et al, U.S. Pat. No. 3,779,806 discloses the use of certain polymers of t-butyl methacrylate for forming resist masks using electron beam exposure. Application Ser. No. 545,063, now U.S. Pat. No. 4,011,351, discloses the use of non-cross-linked films including copolymers of alkyl methacrylates and ethylenically unsaturated monomers containing a halogen substituted substituent in amounts of 1 to 50 mole percent where the halogen substituent is attached either to a carbon of the polymer chain or to a methyl group attached to a carbon of the polymer chain or post halogenated alkyl methacrylate polymers. The E. D. Roberts article discloses the use of cross-linked films which are prepared by heating mixtures of a copolymer of methyl methacrylate and methacrylic acid with a copolymer of methyl methacrylate and methacryloyl chloride to form anhydride linkages by reaction of the acid chloride and acid groups.

The processes described in U.S. Pat. Nos. 3,535,137; 3,779,806; and application Ser. No. 545,063, now U.S. Pat. No. 4,011,351, involve main chain degradation and/or the splitting off of the ester moiety in order to lower the molecular weight of the polymer in the exposed areas and thereby increase the solubility of the exposed areas. Roberts, on the other hand, introduces anhydride cross-links which initially insolublize the polymer layer upon prebaking by not only increasing the molecular weight but by changing the nature of the functional groups. These cross-links are then broken during exposure to make the exposed portions soluble. Roberts requires mixtures of two different copolymers and his reported data indicates that only a portion of the acid chloride and acid groups react to form cross-links. Accordingly, the nature of any particular unexposed resist film would be unpredictable. Additionally, the unexposed film is not soluble in ordinary solvents so that stripping the layer after it has fulfilled its purpose involves chemically breaking down the material such as by reaction with a concentrated base to hydrolyze the cross-links before the film can be removed. Such treatments can have an adverse affect on certain substrate layers which are involved in integrated circuit formation.

A process has now been found which employs a different group of alkyl methacrylate copolymers which, upon prebaking, cross-link in a predictable fashion in that complete reaction of the cross-linking moiety is approached. A more radiation sensitive higher molecular weight polymer structure is produced which requires only a single copolymer to form the resist layer without any change in functionality occurring by the cross-linking reaction. Therefore, the unexposed films can be easily stripped by solvents without the need to chemically attack the polymer.

BRIEF SUMMARY OF THE INVENTION

In accordance with this invention there is provided a process for producing a positive relief image comprising coating a substrate with a layer consisting essentially of a copolymer containing about 90-98 mole percent of polymerized lower alkyl methacrylate units and about 2-10 mole percent of polymerized lower haloalkyl methacrylate units in which the alkyl group is substituted with at least one halogen atom, heating the layer to cause cross-linking between polymer chains with the removal of hydrogen halide, patternwise exposing the layer with high energy radiation, and removing the exposed portion of the layer with a solvent developer.

DETAILED DESCRIPTION

The copolymers which are employed according to the invention are copolymers of a lower alkyl methacrylate, where the alkyl group contains 1-6 carbons such as methyl, ethyl, propyl, butyl, isopropyl, pentyl, hexyl, and tertiary butyl and a halogen substituted lower alkyl methacrylate containing 1-4 carbons such as, for example, chloromethyl methacrylate, 2-chloroethyl methacrylate, dichloroethyl methacrylate, chlorobromoethyl methacrylate and chlorobutyl methacrylate. The preferred halogen is chlorine, but bromine and iodine, which are less reactive in forming cross-links, can also be used as well as mixtures of halogens. A single chlorine in the pendent chain is effective to promote cross-linking on heating and the chlorine atoms approach complete reaction.

The halogen containing monomer compounds can be easily prepared by replacing a hydroxyl group with a halogen. Although no particular advantage is obtained, more than one halogen atom can be substituted onto the pendent chain. The preferred materials have two carbons and one chlorine in the pendent chain, which gives polymers having good film forming properties, almost totally effective cross-linking upon heating the film and which, with methyl methacrylate, form completely random copolymers due to almost identical reactivity ratios. A general formula for suitable copolymers can be expressed as follows:

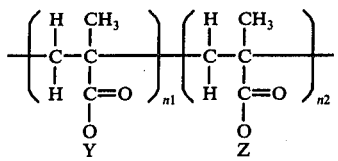

where $n_1$ and $n_2$ are integers equal to one or more; where Y is a lower alkyl having 1-6 carbons; where Z is $CH_2X$, $C_2H_4X$, $C_2H_3X_2$, $C_3H_6X$, $C_3H_5X_2$, $C_4H_8X$, $C_4H_7X_2$ and where X is Cl, Br, I or a mixture.

The amount of haloalkyl methacrylate monomer which is employed to form the copolymer is important in that an amount of 15 mole percent or more has been found to give resist layers which are so highly cross-linked on heating that an image is not developed under normal processing conditions. Accordingly, a suitable range is from about 2 to about 10 mole percent of the haloalkyl methacrylate and 90 to 98 mole percent of alkyl methacrylate. The optimum amount varies depending upon the particular haloalkyl methacrylate monomer which is employed.

The copolymers can be prepared by conventional free radical initiated emulsion or suspension polymerization techniques to give high polymers. The preferred range of weight of the copolymers is from about 100,000 to 500,000 (weight average molecular weight) with a dispersity of about 2.8 to 4.4 ($N_w/N_n$, weight average molecular weight/number average molecular weight).

Films of the polymers are cast from solvent solutions containing, for example, from about 1 to about 20 percent by weight of solution of the polymers. Suitable solvents should have boiling points which are below the decomposition point of the polymer to permit removal of the solvent from the cast film by heating. Examples of suitable solvents are chloroform, acetone, cellosolves such as methyl cellosolve, ethyl cellosolve acetate, and mixtures of the above solvents, with or without water.

The films can be cast in various thicknesses of from about 50 angstroms to about 10 microns, depending upon the intended use of the resist image as is conventional in the art. For example, from about 0.5 to about 2.0 microns thick for an etch process or from about 1.5 to about 3.0 microns thick for a lift off metallurgy process. The casting process is conventional such as by spinning or dip coat.

The resist film is heated or prebaked in order to remove the solvent, anneal out any strains in the film, and to cause the cross-linking of polymer chains due to the elimination of hydrogen halide molecules. Prebaking temperatures of about 180° to 210° C for 30 to 60 minutes are sufficient to accomplish the cross-linking. In this reaction the halogen atom can react with any hydrogen atom and be condensed off. The hydrogens may be on the same or different chains from the halogen and the formation of the cross-links does not depend upon the way the original monomer units of haloalkyl methacrylate and alkyl methacrylate were linked together. The effect of the cross-linking is to increase the molecular weight of the polymer film such that its solubility is decreased. Accordingly, in the exposed portion, the breaking of the cross-links, as well as the degrading of the polymer chains, enhances the solubility difference between the exposed and unexposed portion for a given amount of exposure energy. This results in the developing of good resist images at practical exposure dosages, within reasonable times, with negligible loss of unexposed resist layer thickness.

The resist layer is exposed patternwise to radiation such as, for example, electrons or x-rays which act to rapidly degrade the molecular weight of the resist layer. The sensitivity of the resist layer makes them particularly useful in processes employing low energy electron beam radiation. The specific exposure flux will normally be dependent upon the particular polymeric material selected, the thickness of the polymeric resist, and the degree of cross-linking. Generally, for exposure of the resist layer in thicknesses of about 50 angstroms to about 10 microns electron beam radiation dosages of from $10^{-6}$ coulombs/cm$^2$ to about $10^{-3}$ coulombs/cm$^2$ are employed at an accelerating potential in the range from about 1 to about 50 kv and preferably from about 10 to about 30 kev.

After exposure, the exposed portions of the polymeric film are removed with a suitable solvent. A wide range of developers can be employed when using the polymers of the invention, for example, cellosolves such as methyl cellosolve, ethyl cellosolve acetate, cyclic and non-cyclic ketones, ethyl alcohol, either dessicated or with water added, chlorinated hydrocarbons, and mixtures of the above.

The solvent development is preferably carried out in a temperature range of about 10° to about 50° C. Excellent resist images are produced with about 90% of the unexposed resist layer remaining after development or a (R/Ro) ratio of 10 or more (where R is the rate of loss of exposed resist in angstroms per minute and Ro is the rate of loss of unexposed resist layer thickness in angstroms per minute).

The resist films can be easily solvent stripped after the processing of the substrate in solvents such as N-methyl pyrrolidone or methyl cellosolve at temperatures of about 80° to 110° C.

The process of the invention is further illustrated by, but is not intended to be limited to the following examples wherein parts are parts by weight unless otherwise indicated.

EXAMPLE A

Preparation of methyl methacrylate/2-chloroethyl methacrylate copolymer.

Into a nitrogen purged (0.5 cu ft/minute) 500 ml 3 neck flask fitted with a stirrer, thermometer and a $N_2$ purge tube is added 150 ml of deionized $H_2O$ which is stirred at 450± 50 rpm. 12.0 grams of Triton X-200 surfactant is added and stirred for 5 minutes. 5.0 ml of a solution of 0.300 gram of ferrous sulfate in 200 ml of deionized $H_2O$ is added and stirred for one minute after which is added 0.200 grams of ammonium persulfate dissolved in 20 milliliters of deionized water with stirring during 1 minute. A mixture of 45.0 ml of methyl methacrylate, containing 100 ppm of hydroquinone inhibitor, and 5.0 ml of 2-chloroethyl methacrylate, containing 100 ppm of hydroquinone inhibitor, are added followed by 0.200 grams of sodium meta-bisulfite in 20 ml of deionized water. The temperature rises from 23° C to 42° C in about 7 minutes and the reaction is completed in about 30 minutes. The reaction mixture is precipitated by pouring it into 2 liters of methanol. The precipitated polymer is filtered, washed with two one liter portions of deionized water, air dried and then vacuum dried for 16 hours at 30 inches Hq vacuum at a temperature of 30° C± 5° C. A 93/7 mole percent ratio methyl methacrylate/2-chloroethyl methacrylate copolymer is produced in a yield of about 35 grams. The same procedure was employed to prepare 85/15 and 68/32 mole ratio methyl methacrylate/2-chloroethyl methacrylate copolymers by altering the portions of monomers accordingly.

The weight average molecular weights of the polymers range from 200,000 to 460,000 and the dispersity ($N_w-/N_n-$) ranges from 2.8 to 4.4.

EXAMPLE 1

Portions of the polymers prepared in Example A were placed in methyl cellosolve to give an 8 weight percent casting solution. Each solution was filtered through a 1.2 micron filter and coated to about a 1 micron (10,000 angstrom) thickness on 2¼ inch silicon semiconductor wafers having a 5,000± 1,000 angstrom thick coating of thermal $SiO_2$. The samples were prebaked in air at a temperature of 200° C± 5° C for 30 minutes. The positive resist layers were patternwise exposed by a focused, scanning electron beam at a beam current of 3 milliamp with two passes to produce an exposure dosage of about $10 \times 10^{-5}$ coulombs/cm². Development was in ethyl cellosolve acetate at temperatures of either 26± 0.5° C or of 35± 0.5° C. The polymers containing 15 and 32 mole percent of polymerized 2-chloroethyl methacrylate units were so highly cross-linked that a developed image was not produced at a development temperature of 26°± 0.5° C. The resist layer prepared from the polymer containing 7 mole percent of polymerized 2-chloroethyl methacrylate units developed completely at a temperature of 26°± 0.5° C to give excellent images in 7 minutes with a rate of loss of exposed resist of 1,500 angstroms per minute and a rate of loss of unexposed resist of 71 angstroms per minute or a (R/Ro) ratio of 21.0. Samples developed at 35± 0.5° C with the 7 mole percent copolymer gave a completely developed image in 2 minutes with a R of 5250 angstroms/min and an Ro of 500 angstroms/min or an (R/Ro) of 10.5. The 15 mole percent polymer developed a clean image but with swollen edges after a development time of 1.33 minutes. The polymer containing 32 mole percent of 2-chloroethyl methacrylate did not develop an image after 20 minutes. The process was repeated with the 32 percent copolymer using a lower temperature 100° C prebake in which case an image was developed in about 20 seconds but with an (R/Ro) ratio of only 1.7. This excess of loss of unexposed resist and too rapid development is unsatisfactory.

The developed 7 mole percent 2-chloroethyl methacrylate copolymer resist layers were successfully used as etching masks to etch through the $SiO_2$ layer with buffered HF. After the etching the resist layers were easily and completely stripped from the wafers in 30 to 60 minutes by immersion in N-methyl pyrrolidone at a temperature of about 100° C.

EXAMPLE 2

In order to compare the process of the invention with one employing polymethyl methacrylate, a polymethyl methacrylate having a molecular weight of about 400,000 was used according to the process of Example 1 to form a patterned resist layer under the same process conditions except that prebaking was at 160° C in order to avoid degradation of the polymer. Under these conditions, complete development took place in .33 minutes at a development temperature of about 35° C with an R rate of 18,500 and an $R_o$ rate of 13,200 to give an (R/Ro) ratio of 1.4. An acceptable (R/Ro) ratio would be a minimum of about 2.0 which is needed so that the remaining resist thickness will be sufficient to protect the substrate due to the occurrence of voids or pin holes in the resist layer.

It can be seen from the above examples that the process of the invention gives enhanced sensitivity in that the loss of unexpected resist layer is an order of magnitude less than that obtained with polymethyl methacrylate under the same exposure conditions.

The novel resist process employs resist layers which can be cast, developed and stripped using a wide range of solvents to produce excellent images with little loss of unexposed resist. The resist forms a easily controlled and reproducable cross-linked layer employing only a single copolymer material to form the layer.

Although the invention has been particularly shown and described with reference to preferred embodiments thereof, it will be understood by those skilled in the art that the foregoing and other changes in form and details may be made therein without departing from the spirit and scope of the invention.

What is claimed is:

1. A process for producing a positive relief image comprising coating a substrate with a layer consisting essentially of a copolymer containing about 90 to 98 mole percent of polymerized lower alkyl methacrylate units and about 2 to 10 mole percent of polymerized lower haloalkyl methacrylate units, wherein the copolymer has the general formula:

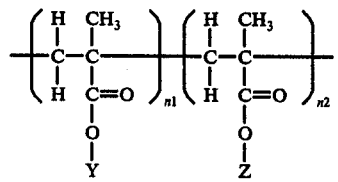

where $n1$ and $n2$ are integers equal to one or more; where Y is a lower alkyl having 1–6 carbons; where Z is $CH_2X$, $C_2H_4X$, $C_2H_3X_2$, $C_3H_6X$, $C_3H_5X_2$, $C_4H_8X$, $C_4H_7X_2$ and where X is CL, Br, I or a mixture, heating the layer to cause cross-linking between polymer chains with removal of hydrogen halide, patternwise exposing the layer with high energy radiation, and removing the exposed portion of the layer with a solvent developer.

2. The process of claim 1 including the step of removing the cross-linked layer with an organic solvent.

3. The process of claim 1 wherein the alkyl group of the lower alkyl methacrylate contains 1 to 6 carbon atoms.

4. The process of claim 1 wherein the lower haloalkyl methacrylate contains 1-4 carbons and the halogen is selected from the group consisting of Cl, Br, I and mixtures thereof.

5. The process of claim 1 wherein the heating is carried out at a temperature of from about 180°–210° C for from 30 to 60 minutes.

6. A process for producing a positive resist mask on a substrate comprising coating the substrate with a layer consisting essentially of a copolymer containing about 90 to 98 mole percent of polymerized methyl methacrylate units and about 2 to 10 mole percent of polymerized 2-chloroethyl methacrylate units, heating the layer to cause cross-linking between polymer chains with removal of hydrogen chloride, patternwise exposing the layer with a focussed, scanning electron beam, and removing the exposed portion of the layer with a solvent developer.

* * * * *